(12) United States Patent
Rösner et al.

(10) Patent No.: US 6,424,562 B1
(45) Date of Patent: Jul. 23, 2002

(54) READ/WRITE ARCHITECTURE FOR MRAM

(75) Inventors: Wolfgang Rösner, Ottobrunn; Siegfried Schwarzl, Neubiberg, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/905,830

(22) Filed: Jul. 13, 2001

Related U.S. Application Data

(63) Continuation of application No. PCT/DE00/00026, filed on Jan. 3, 2000.

(30) Foreign Application Priority Data

Jan. 13, 1999 (DE) .......................... 199 00 979

(51) Int. Cl.$^7$ .............................................. G11C 11/00
(52) U.S. Cl. ...................... 365/158; 365/171; 365/173
(58) Field of Search ................................. 365/158, 171, 365/173, 50, 55, 66, 74, 189.01

(56) References Cited

U.S. PATENT DOCUMENTS

| | | | |
|---|---|---|---|
| 3,863,231 A | 1/1975 | Taylor | |
| 5,541,868 A | 7/1996 | Prinz | |
| 6,072,718 A | * 6/2000 | Abraham et al. | ........... 365/173 |

FOREIGN PATENT DOCUMENTS

FR    2.071.501    9/1971

* cited by examiner

*Primary Examiner*—David Nelms
*Assistant Examiner*—David Lam
(74) *Attorney, Agent, or Firm*—Laurence A. Greenberg; Werner H. Stemer; Gregory L. Mayback

(57) ABSTRACT

A read/write architecture for a MRAM is described. The read/write architecture uses resistance bridges during the read process, whereby a memory cell in the resistance bridges having a known state of magnetization is compared with a memory cell that is to be measured.

11 Claims, 4 Drawing Sheets

READ/WRITE ARCHITECTURE FOR MRAM

CROSS-REFERENCE TO RELATED APPLICATION

This application is a continuation of copending International Application No. PCT/DE00/00026, filed Jan. 3, 2000, which designated the United States.

BACKGROUND OF THE INVENTION

1. Field of the Invention

The present invention relates to a read/write architecture for a magnetoresistive random access memory (MRAM) addressable via word lines and bit lines. The MRAM has a multiplicity of ferromagnetic memory elements that are disposed at crossovers between word lines and bit lines. The memory elements at the crossovers form rows and columns of a matrix, which furthermore each contain two ferromagnetic layers separated by a separating layer, and whose resistance perpendicular to the layer sequence is in each case higher than that of the word lines and of the bit lines and depends on the magnetization state of the ferromagnetic layers.

As is known, MRAMS are non-volatile random access memories which, in comparison with other types of non-volatile and also volatile memories such as, for example, DRAMs, FRAMS (ferroelectric RAMs), EEPROMS (electrically erasable and programmable ROMs or read-only memories) and FLASH memories, are distinguished by advantages such as, in particular, high storage densities ranging into the order of magnitude of 100 Gbits/chip or more, simple process architectures and hence low fabrication costs per bit.

The cell arrays of MRAMS expediently contain metallic word lines and bit lines, also called write lines and read lines, which are disposed in a matrix-like manner and are disposed one above the other such that they respectively run in the x-direction and y-direction in a Cartesian xy coordinate system, and between which the ferromagnetic memory elements are provided at the crossovers between the word lines and the bit lines. The ferromagnetic memory elements contain at least two ferromagnetic layers that lie one above the other and are magnetically decoupled, which is effected by a separating layer provided between the ferromagnetic layers. The separating layer may be a tunneling barrier made, for example, of aluminum oxide ($Al_2O_3$) or a non-ferromagnetic conductive layer made, for example, of copper.

The ferromagnetic layers are composed, for example, of iron, cobalt, nickel, permalloy (NiFe), etc., it being possible for them to contain additions such as platinum, for example, which promote a finely crystalline state.

The ferromagnetic layers may have a layer thickness of between 3 and 20 nm, while the separating layer located between them may have a thickness of 1 to 3 nm.

The ferromagnetic layers of each memory element have switching fields of different magnitude and can therefore be subjected to magnetization reversal independently of one another by switching currents in the word lines and bit lines, which form interconnects. In this case, the resistors of the individual memory elements have resistances dependent on the relative magnetization of the ferromagnetic layers that form them. If both ferromagnetic layers are magnetized parallel to one another, then the memory element has a resistance $R_0$, while a resistance $R_0+\Delta R$ ($\Delta R>0$) is present in the case of antiparallel magnetization of the two ferromagnetic layers. The ratio $\Delta R/R_0$ is about 0.1 ... 0.2. This effect is referred to as the magnetoresistance effect. The term magnetoresistive memory elements is also customary for the ferromagnetic memory elements.

These two resistances of the ferromagnetic layers, that is to say the resistance $R_0$ for parallel magnetization and the resistance $R_0+\Delta R$ for the antiparallel magnetization, can be assigned the quantities "0" and "1" of binary memories.

Writing to MRAMs is simple, in principle, if the fact that the requisite switching field strengths have to be achieved by the interconnects is disregarded. It has proved more difficult for the information stored as resistances in the memory elements to be read out reliably and as simply as possible, that is to say without the assistance of selection transistors, which enlarge the memory cell areas and make the fabrication process more complex.

Various efforts have already been made to configure the read-out securely and reliably without selection transistors. A principal problem in reading the memory cells disposed in high memory density with a cell area of 4 $F^2$ (F=minimum feature size) is that each memory cell, that is to say each resistive element whose resistance is to be determined, is "shunted" through a multiplicity of parallel current paths, which makes it problematic to determine the resistance exactly, especially in large memory cell arrays.

In order to overcome these difficulties, two read-out methods have previously been disclosed for MRAMS.

In the first method, the word lines and the bit lines are electrically insulated from one another, and the read current flows through a relatively small number, for example ten, of memory elements connected in series. The resistance of a relevant memory element can then be inferred from the change in the read current by a relatively complex circuit (in this respect, see the reference by D. D. Tang, P. K. Wang, V. S. Speriosu, S. Le, R. E. Fontana, S. Rishton, IEDM 95–997).

The method requires write currents through the two interconnects (word line and bit line) which cross at the relevant memory element. The number of memory elements connected in series is limited by the relative change in the total resistance, which change becomes ever smaller as the number increases, and the measurement of the current change, which measurement becomes more difficult. The small number of memory elements that can be connected in series with one another necessitates a large outlay on circuitry for the periphery of the memory array and thus results in a large area requirement for the read electronics.

The second read-out method consists in all word lines and bit lines, with the exception of the word line connected to the selected memory cell, being put at "0" potential. A potential not equal to zero is applied to the selected word line, while the selected bit line and all other bit lines are brought to a "virtual" zero potential by using an operational amplifier for current measurement (in this respect, see Published, Non-Prosecuted German Patent Application DE 197 40 942 A1).

Both methods have the disadvantage that they are based on the determination of the absolute value of the resistance of the individual memory elements, as a result of which very stringent technological requirements are placed on accurate, reproducible and homogeneous setting of the resistances over the entire memory cell array and also over a semiconductor wafer or a plurality of semiconductor wafers. Equally, it must be taken into consideration here that in the case of the relatively small changes of $\Delta R/R_0$, temperature fluctuations can bring about changes in the resistance which make it more difficult to reliably determine the magnetization states of individual memory elements and hence to read the latter. In addition, in the second method, the finite bit line resistances have the effect that the condition of a virtual zero potential is met only at the ends of the bit lines, with the result that parasitic shunt currents have an adverse effect in the case of long bit lines.

SUMMARY OF THE INVENTION

It is accordingly an object of the invention to provide a read/write architecture for a MRAM that overcomes the above-mentioned disadvantages of the prior art devices of this general type, which, in conjunction with a simple construction, allows reliable reading of the memory cell array and does not place unrealistically stringent requirements on the exact, reproducible and homogeneous setting of the resistances of the individual memory cells.

With the foregoing and other objects in view there is provided, in accordance with the invention, a read/write architecture for a magnetoresistive random access memory (MRAM). The read/write architecture contains bit lines, word lines crossing over the bit lines, and a multiplicity of ferromagnetic memory elements disposed at the crossover points of the word lines and the bit lines and forming rows and columns of a matrix. Each of the ferromagnetic memory elements contains a layered sequence having a separating layer and two ferromagnetic layers separated by the separating layer. The ferromagnetic memory elements have a resistance perpendicular to the layer sequence in each case higher than that of the word lines and of the bit lines and depends on a magnetization state of the ferromagnetic layers. The ferromagnetic memory elements are each connected between one of the word lines and one of the bit lines. At least one of the ferromagnetic memory elements functions as a reference memory element having a known magnetization state. Connections between the reference memory element and each of the ferromagnetic memory elements defines taps of resistance bridges and a resistance ratio of each of the ferromagnetic memory elements to the reference memory element can be determined by the resistance bridges. Each of the resistance bridges includes the reference memory element and one of the ferromagnetic memory elements.

In the case of a read/write architecture according to the invention, the object is achieved by virtue of the fact that the ferromagnetic memory elements are each connected between one of the word lines and one of the bit lines, at least one reference memory element has a known magnetization state, and the resistance ratio of each memory element to the reference memory element can be determined by resistance bridges.

In the case of the read/write architecture according to the invention, then, by use of special external circuitry of the memory cell array, which forms a "resistor grid", the magnetization state of the individual memory elements, that is to say the parallel or antiparallel magnetization of the ferromagnetic layers, is not determined by absolute measurement of the resistance—the customary procedure hitherto in the prior art—but rather by resistance comparison with memory elements of a known magnetization state. In this case, at least one memory element must be provided as a reference memory element, in which case a whole column and/or a whole row of memory elements may expediently also have a known magnetization state. In this case, such a known magnetization state is, for example, a parallel magnetization of both ferromagnetic layers with the low resistance $R_0$ or an antiparallel magnetization of the two resistive layers with the resistance $R_0+\Delta R$ ($\Delta R>0$). The known magnetization state should be written in before the actual read process.

The resistances are compared by resistance bridges, namely half-bridges or full-bridges, which are produced by the abovementioned external circuitry of the resistor grid.

At the center taps of the resistance bridges, voltages arise which make it possible to infer the relative magnitude of the resistances in the resistance bridges and thus the information stored in the individual memory elements, that is to say "0" (for example parallel magnetization) or "1" (for example antiparallel magnetization).

With vanishing shunt voltage across the resistance bridges, the resistances correspond and both have the value $R_0$, for example. However, if the shunt voltage differs from zero, then the resistance sought has a value that deviates from the resistance of the reference memory element, namely $R_0+\Delta R$, for example.

During reading, by way of example, a voltage $-V/2$ can be applied to the reference memory element, while the voltage $+V/2$ can then be applied to a memory element to be read.

The materials for the individual memory elements are the same as has already been mentioned above. The separating layer between the ferromagnetic layers may be composed of, for example $Al_2O_3$ (i.e. a barrier layer) or of copper and have a layer thickness of between 1 and 3 nm, while the ferromagnetic layers themselves are constructed in a customary manner from iron, cobalt, nickel, permalloy with corresponding additions (for example platinum) and have a layer thickness of between 3 and 20 nm.

An advantageous development of the invention provides for current followers or amplifiers to be used for resistance comparison purposes in the individual resistance bridges and for their output voltage to be independent of the number m of word lines in the resistor grid. As a result, it is possible to use large cell arrays, so that the area ratio of the memory cell array to the read-out electronic also increases.

An essential advantage of the invention is that it enables a large memory cell array with memory cells without selection transistors, even the measurement signal obtained when reading a memory cell being able to be made independent of the size of the memory cell array with the aid of the abovementioned current follower.

Additional advantages that can be attained by the invention can be summarized as follows. The read-out electronics are constructed comparatively simply and merely have the task of distinguishing between symmetry or asymmetry of the individual resistance bridges. In contrast to the prior art, the measurement signal is completely independent of the absolute value of the individual resistive elements; it merely depends on the voltages applied to the memory cell array and the magnetoresistance effect $\Delta R/R_0$ of the individual memory elements. The technological requirements placed on accuracy, reproducibility and homogeneity in the fabrication of the memory cell array are reduced since reading is based solely on the comparison of resistors that are closely adjacent to one another within the memory cell array. In contrast to the absolute value determination of the resistances which is customary in the case of the prior art, in the case of the read/write architecture according to the invention the measurement signal is used in its full magnitude for distinguishing the two resistance states and is not just contained in a small change in the measurement quantity. Temperature-dictated changes in resistance have no influence on the read signal since they cancel out in the bridge circuit. It is possible to read relatively large memory cell arrays without selection transistors, which results in considerable advantages in respect of storage density, process simplicity and costs per bit. Line resistances of the word lines and of the bit lines are at last partly ineffectual for symmetry reasons.

Other features which are considered as characteristic for the invention are set forth in the appended claims.

Although the invention is illustrated and described herein as embodied in a read/write architecture for a MRAM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
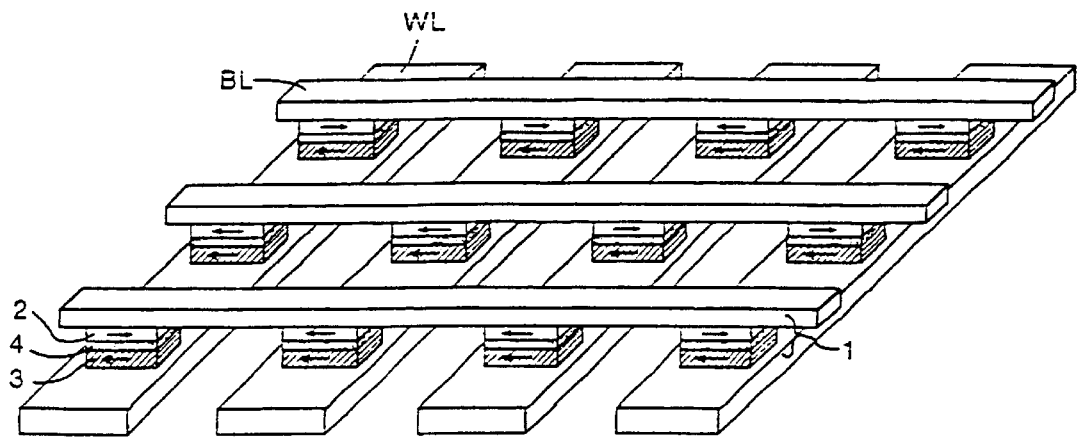
FIG. 1 is a diagrammatic, perspective view of a memory cell array of a MRAM without selection transistors according to the invention.

In all the figures of the drawing, sub-features and integral parts that correspond to one another bear the same reference symbol in each case. Referring now to the figures of the drawing in detail and first, particularly, to FIG. 1 thereof, there is shown a memory cell array of a magnetoresistive random access memory (MRAM) without selection transistors with so-called "4 F$^2$" memory cells containing ferromagnetic memory elements 1, word lines WL and bit lines BL. In this case, the memory cells 1 are located at crossovers between the word lines WL and the bit lines BL and each contain ferromagnetic layers 2, 3, between which a separating layer 4 is provided. The separating layer 4 may be a tunneling barrier made, for example, of aluminum oxide, or a non-ferromagnetic conductive layer made, for example, of copper.

The word lines WL and the bit lines BL run in the y-direction and x-direction, respectively, with the result that the memory cells 1 form a matrix-like resistor grid.

The resistance of the individual memory cells 1 depends on the magnetization directions of the two ferromagnetic layers 2, 3. In the case of parallel magnetization of the ferromagnetic layers 2, 3 with respect to one another, the resistance is small and has a value $R_0$, while in the case of antiparallel magnetization of the resistive layers 2, 3, the resistance has a magnitude $R_0+\Delta R$, $\Delta R>0$.

The word lines WL and the bit lines BL, which form interconnects, may be composed of aluminum, for example. Preferred layer thicknesses for the ferromagnetic layers 2, 3 are 3 to 20 nm, for example, and for the separating layers 4 are 1 to 3 nm, for example.

Application of corresponding electric voltages to a specific word line WL and a specific bit line BL enables the ferromagnetic layers 2, 3 of a memory element 1 located at the crossover point between the word line WL and the bit line BL to be magnetized in a parallel or antiparallel manner.

A parallel magnetization with low resistance can then be assigned to a logic "0", for example, while an antiparallel magnetization with high resistance corresponds to a logic "1".

Figure 2:
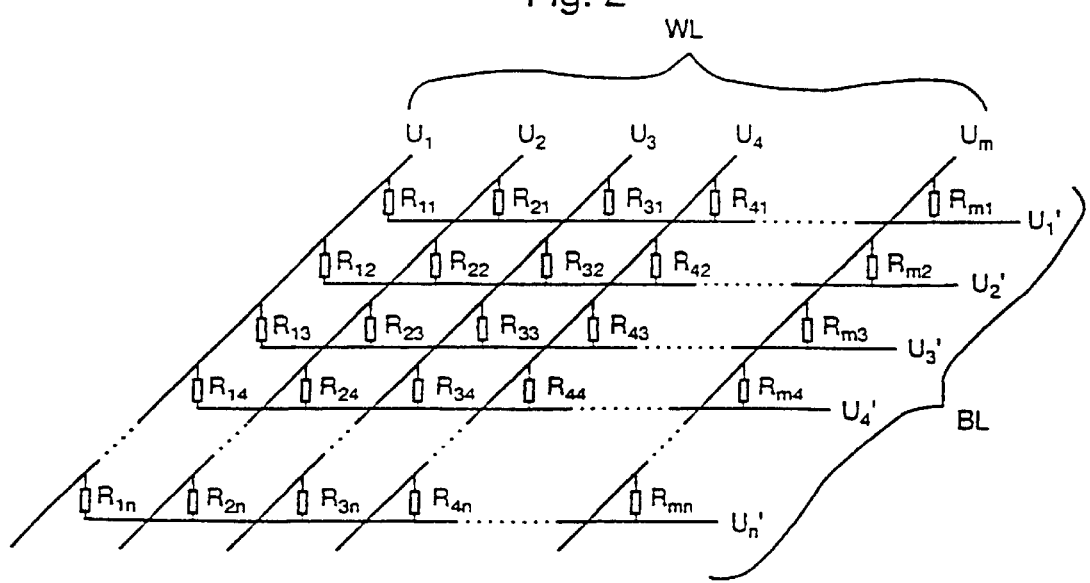
FIG. 2 is a circuit diagram of the memory cell array in accordance with FIG. 1.

FIG. 2 shows an electrical circuit diagram of the memory cell array shown in FIG. 1, in which case voltages $U_1$, $U_2$, ..., $U_m$ are present on m word lines WL and voltages $U_1'$, $U_2'$, ..., $U_n'$ are present on n bit lines BL. The individual memory cells are illustrated by resistors $R_{11}$, $R_{21}$, ..., $R_{12}$, $R_{22}$, ... $R_{ik}$, ..., $R_{mn}$. FIG. 2 shows how the individual memory cells form a resistor grid, the resistances of the individual resistors $R_{ik}$ depending on the magnetization state thereof (parallel magnetization with low resistance or antiparallel magnetization with high resistance).

Figure 3:
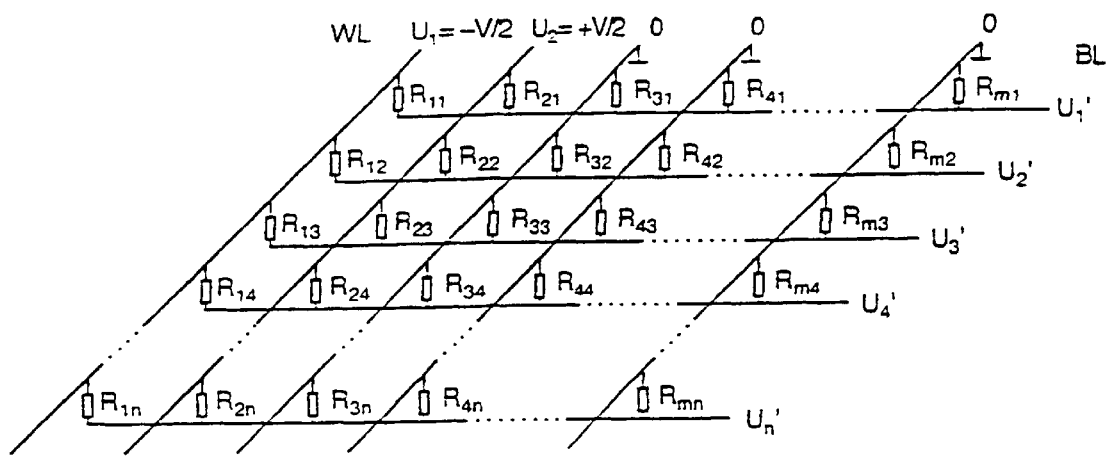
FIG. 3 is a circuit diagram of the memory cell array shown in FIG. 2 in the case of a read-out operation.

A voltage of −V/2 and of +V/2 is then respectively applied to two arbitrary word lines WL, with the result that $U_i=-V/2$ and $U_k=+V/2$ (FIG. 3). A potential "0" is present on the remaining word lines WL. This situation is illustrated in FIG. 3 for the case i=1 and k=2.

Figure 4:
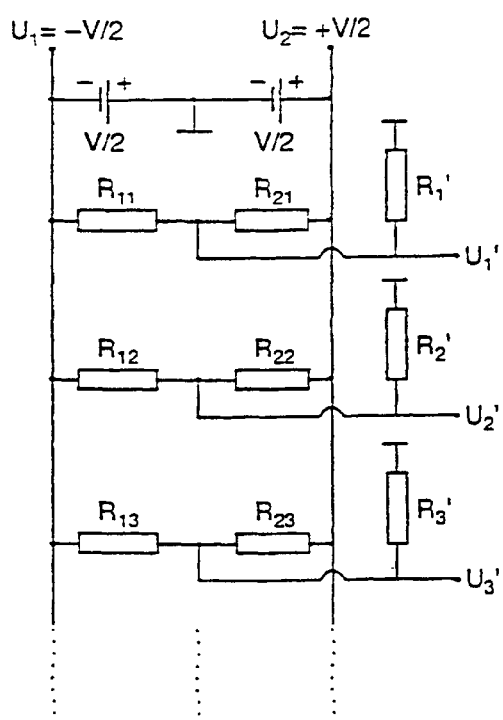
FIG. 4 is a circuit diagram of an electrical circuit of half-bridges when voltages −V/2 and +V/2 are present on word lines.

The parallel short circuit of the resistors $R_{31}$, $R_{41}$, ..., $R_{32}$, $R_{42}$, ..., $R_{3k}$, $R_{4n}$, ..., $R_{mn}$—at potential "0"—of each bit line BL gives rise to half-bridges, as is illustrated diagrammatically in FIG. 4, in which case the resistor $R_1'$ denotes the resistance of the resistors $R_{31}$, $R_{41}$, ..., $R_{m1}$ connected in parallel with one another. The same applies correspondingly to the resistors $R_2'$ and $R_3'$.

The voltages $U_1'$, $U_2'$, $U_3'$, ..., $U_i'$ (i=1, 2, ..., n) depend on a ratio of the two resistances in each half-bridge: by way of example, if $R_{11}=R_{21}$, then $U_1'=0$. If $U_1'<0$, then $R_{11}<R_{21}$. By contrast $U_1'>0$ is assigned to $R_{11}>R_{21}$.

For the shunt resistors $R_i'$, across which the voltages $U_1'$, ... $U_i'$ are dropped, the following holds true:

$$R_0/(m-2) \leq R_i' \leq (R_0+\Delta R)/(m-2) \tag{1}$$

The lower limit $R_0/(m-2)$ is present if all the resistors $R_{3i}$, $R_{4i}$, ..., $R_{mi}$ exhibit a parallel magnetization of the ferromagnetic layers, while the upper limit $(R_0+\Delta R)/(m-2)$ is applicable if the resistors are all magnetized in an antiparallel manner.

Figure 5:
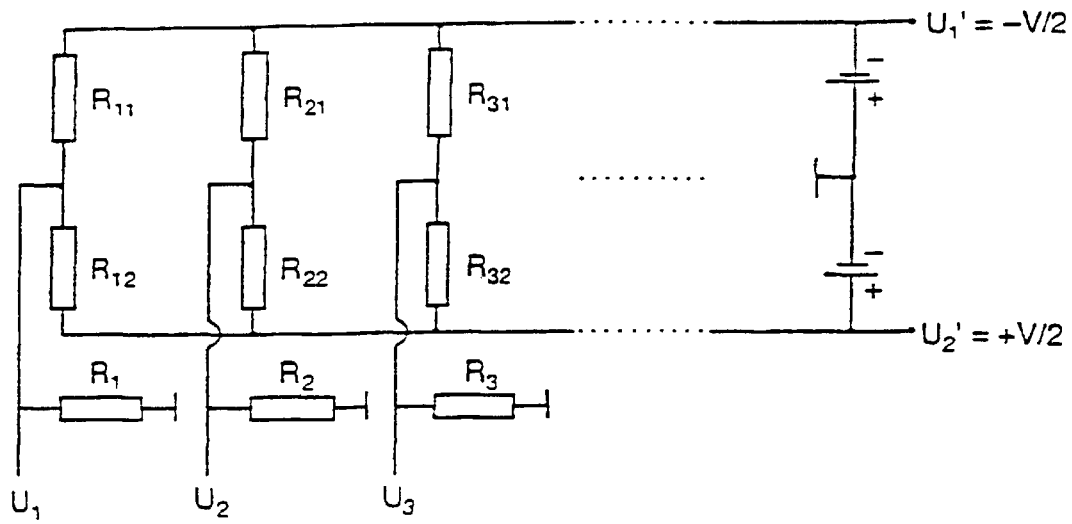
FIG. 5 is a circuit diagram of a circuit of the half-bridges when voltages of −V/2 and +V/2 are present on the bit lines.

Instead of the voltages −V/2 and +V/2 respectively being applied to two word lines WL, it is also possible for two bit lines BL to be connected to the voltages. This case is illustrated diagrammatically in FIG. 5, in which case the voltages $U_1$, $U_2$, ..., $U_i$ (i=1, 2, ..., m) then provide information about the resistance ratios $R_{ik}/R_{ik+1}$ (i=1, 2, ..., m, k−1 ... n).

In this way, it is possible to compare any desired rows or columns with one another.

When writing to such a MRAM, currents of suitable magnitude are simultaneously sent through a respective word line WL and bit line BL. As a result, the memory element located at the crossover between the word line and the bit line can be transferred to a parallel-magnetized state or antiparallel-magnetized state of its ferromagnetic layers 2, 3, which corresponds to a logic "0" or "1".

A subsequent read-out then presupposes that, for example, all the memory elements of a word line, such as the first word line with the voltage $U_i$, are transferred to a known magnetization state, that is to say, for example, to a parallel magnetization of the ferromagnetic layers 2, 3, but the corresponding resistance $R_0$ need not be known.

During reading, the potentials $-V/2$ and $+V/2$ are respectively applied to two word lines, for example the first and the second word line with the voltages $U_1$ and $U_2$, respectively, in FIGS. 2 to 4. The center contact of the voltage source is at zero potential just like the remaining word lines WL3 to WLm connected to one another with low resistance. only shunt resistors $R_i'$ of the resultant half-bridges are formed by the resistors $R_{3i}$ to $R_{mi}$ (i=1, 2, . . . n) connected to each bit line BL being connected in parallel. The voltages $U_i'$ (i=1, 2, . . . , n) are dropped across these resistors $R_i'$, which lie within the interval given above by equation (1), which voltages allow a comparison of the resistors $R_{2i}$ with the resistors $R_{1i}$, as can be shown diagrammatically using FIGS. 6 to 8.

Figure 6:
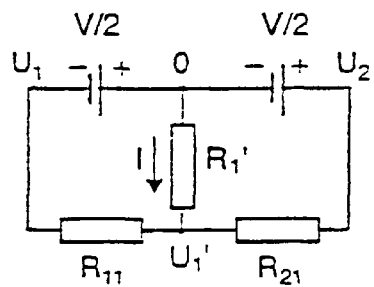
FIGS. 6 to 8 are circuit diagrams of the bridge circuits for elucidating the voltages respectively tapped off at the bridges.
Figure 7:
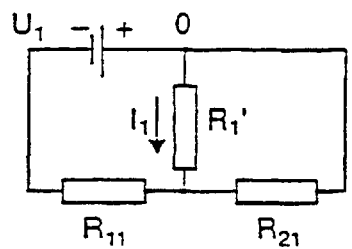
Figure 8:
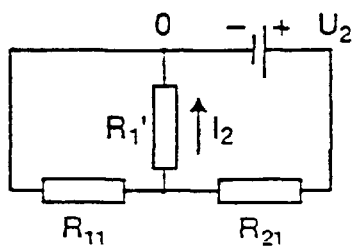

FIGS. 6 to 8 show the bridge voltages $U_i'$ (i=1, . . . , n) for the example of the topmost half-bridge in FIG. 4. The current I through the resistor $R_1'$ (see FIG. 6) results from superposition of the currents $I_1$ (see FIG. 7) and $I_2$ (see FIG. 8), which are generated independently of one another by the two voltage sources $U_1$ and $U_2$, in each case the other voltage source being replaced by a short-circuiting bridge (see FIGS. 7 and 8). The current I generates a voltage $U_1'$ across the resistor $R_1'$, which voltage permits comparative statements about the resistances of the resistors $R_{11}$ and $R_{21}$.

In detail, the currents $I_1$, $I_2$ and I are given by:

$$I_1 = \frac{U_1}{R_{11} + \frac{R_1' R_{21}}{R_1' + R_{21}}} \cdot \frac{R_{21}}{R_1' + R_{21}} = \frac{U_1 R_{21}}{R_{11} R_1' + R_{11} R_{21} + R_1' R_{21}} \quad (2)$$

$$I_2 = \frac{U_2 R_{11}}{R_{11} R_1' + R_{11} R_{21} + R_1' R_{21}} \quad (3)$$

$$I = I_1 + I_2 = \frac{U_1 R_{21} + U_2 R_{11}}{R_{11} R_1' + R_{11} R_{21} + R_1' R_{21}} \quad (4)$$

From this there then follows for the voltage $U_1'$:

$$U_1' = I R_1' = \frac{V}{2} \frac{R_1'(R_{11} - R_{21})}{R_{11} R_1' + R_{11} R_{21} + R_1' R_{21}} \quad (5)$$

For the voltage $U_1'$, the following values are obtained depending on the resistors $R_{11}$ and $R_{21}$ or the magnetization resistances of the ferromagnetic layers 2, 3:

$$U_1' = \begin{cases} 0 \text{ for } R_{11} = R_{21} \\ > 0 \text{ for } R_{11} > R_{21} \\ < 0 \text{ for } R_{11} < R_{21} \end{cases} \quad (6)$$

In general, the following relationships hold true for the comparison of the matrix resistors $R_{ji}$ with the resistors $R_{1i}$ on the first word line WL1:

$$U_i' = \begin{cases} 0 \text{ for } R_{1i} = R_{ji} \\ > 0 \text{ for } R_{1i} > R_{ji} \quad (i = 1 \ldots n; j = 2 \ldots m) \\ < 0 \text{ for } R_{1i} < R_{ji} \end{cases} \quad (7)$$

After the resistances have been ascertained for the first two word lines, for example by comparators on the bit lines BL, the operation can be successively repeated with further word line pairs, that is to say, for example, the word lines WL1 and WL3, WL1 and WL4, . . . , WL1 and WLm, until the magnetization states of all the resistors in the matrix have been determined.

In this case, the following generally holds true for the voltages $U_i'$:

$$U_i' = IR_i' = \frac{V}{2} \frac{R_i'(R_{ii} - R_{ji})}{R_{ji} R_1' + R_{ii} R_{ji} + R_j' R_{ji}} (i = 1 \ldots n; j = 3 \ldots m) \quad (8)$$

With the relationship (1) already mentioned, there follows from this:

$$\frac{V}{2} \Delta \frac{R/R}{\Delta R/R(m-1) + m} \leq U_i' \leq \frac{V}{2} \Delta \frac{R/R}{\Delta R/R + m} \quad (9)$$

As an example, for a memory cell array having 1000 bit lines BL (n=1000) and 100 word lines WL (m=100), a magnetoresistance effect $\Delta R/R_0$=0.2 and voltage sources of 1 V in each case, the following are obtained:

$U_i'$=0 for like resistors in the i-th half-bridge, $U_i'$<0 where 1.67 mV$\leq|U_i'|\leq$2.00 mV for unlike resistors in the i-th half-bridge independently of the resistance $R_0$.

The loading on the current sources is in this case 1000×10 $\mu$A=10 mA for $R_0$=100 kohm and 1000×1 $\mu$A=1 mA for $R_0$=1 Mohm.

Figure 9:
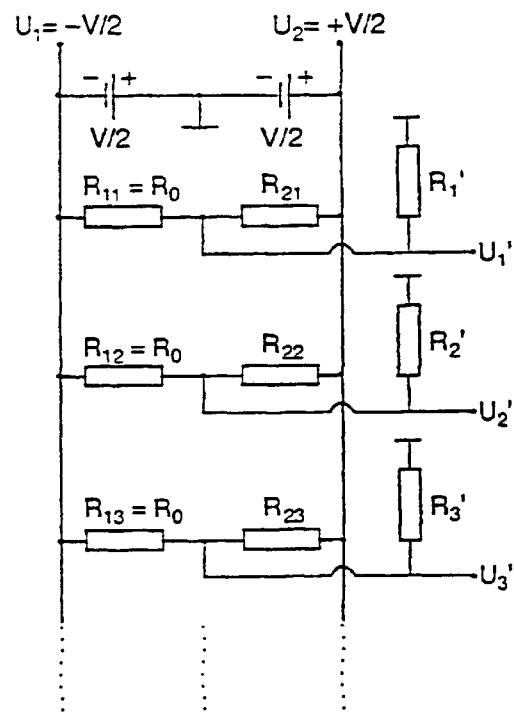
FIG. 9 is a circuit diagram of the bridge circuit that is used to elucidate how different logic states can be obtained depending on the resistances.

FIG. 9 shows a case in which the parallel magnetization state of the ferromagnetic layers 2, 3 with the low resistance $R_0$ has been written in for all the memory elements of the first word line WL 1. From vanishing values of the bridge voltages $U_i'$=0, it then follows that the other resistors of the half-bridges also have the value $R_0$. If their value is negative, however, then these resistors have the higher value $R_0+\Delta R$. The following relationship is thus present:

$$\begin{aligned} U_1' &= 0 \Rightarrow R_{21} = R_0 \\ &< 0 \Rightarrow R_{21} = R_0 + \Delta R \\ U_2' &= 0 \Rightarrow R_{22} = R_0 \\ &< 0 \Rightarrow R_{22} = R_0 + \Delta R \quad (i = 1 \ldots n) \\ U_3' &= 0 \Rightarrow R_{23} = R_0 \\ &< 0 \Rightarrow R_{23} = R_0 + \Delta R \\ U_j' &= 0 \Rightarrow R_{1i} = R_0 \\ &< 0 \Rightarrow R_{2i} = R_0 + \Delta R \end{aligned} \quad (10)$$

In the exemplary embodiments above, the shunt voltages are used to distinguish the small resistance (parallel magnetization) and the large resistance (antiparallel magnetization). In this case, with memory cell arrays having a large number m of word lines and/or n of bit lines, the signals become small approximately proportionally to m (and/or n). In order to avoid this disadvantage, for resistance comparison purposes, current followers are inserted into the individual resistance bridges, the output voltages of which current followers are then independent of the number m of word lines (and/or the number n of bit lines) in the resistor grid.

This entails the additional advantage that large memory cell arrays can be used, which results in that the area ratio of memory cell array to read-out electronics increases.

Figure 10:
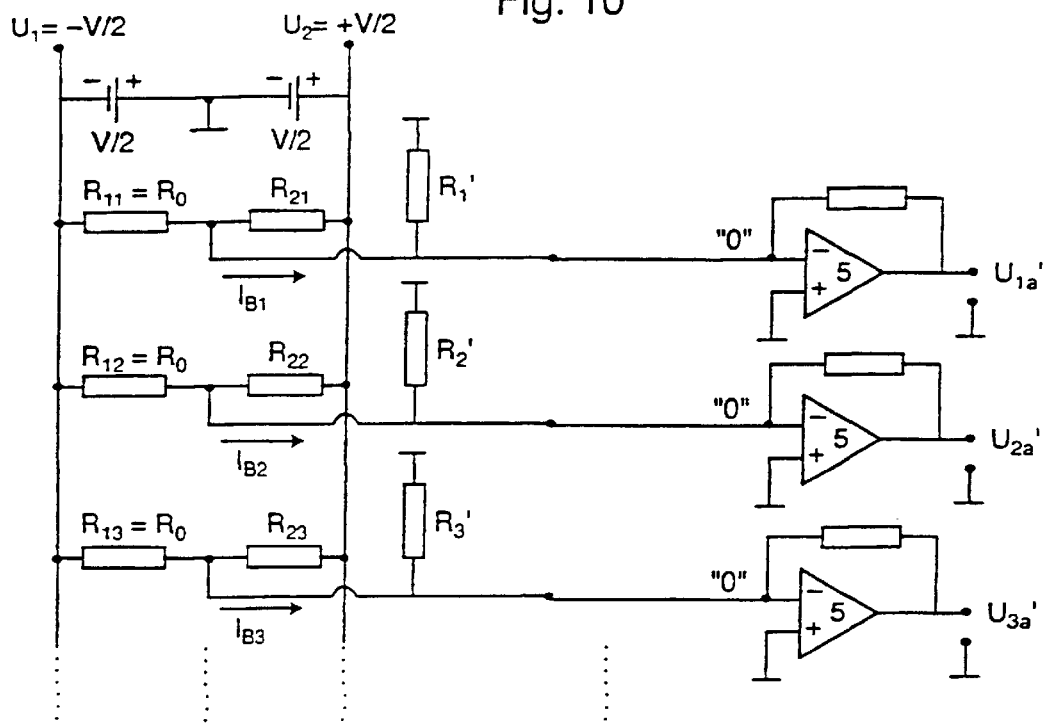
FIG. 10 is a circuit diagram of the bridge circuit with current followers in accordance with a particularly advantageous exemplary embodiment.

FIG. 10 shows an exemplary embodiment in which current followers 5 are provided at the outputs of the individual resistance bridges.

Figure 11:
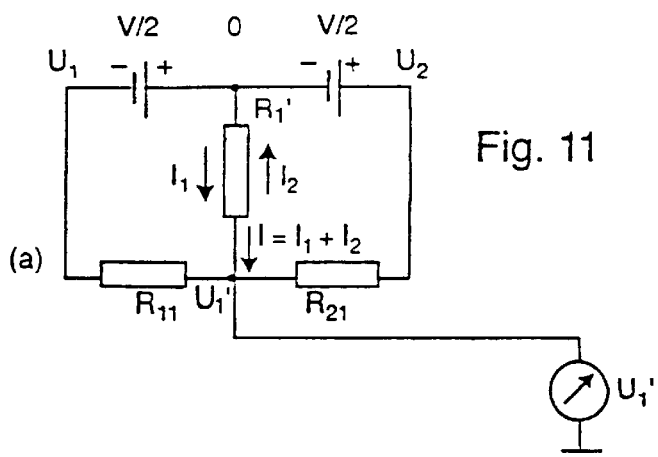
FIGS. 11 and 12 are circuit diagrams showing a comparison between the bridge circuit without a current follower (FIG. 11) and the bridge circuit with the current follower (FIG. 12).

Such current followers make it possible to avoid the disadvantage that the voltage $U_i'$ tends toward zero if the number of word lines m becomes larger and larger. This relationship will be explained below first with reference to FIG. 11.

In accordance with equation (5), the following first holds true:

$$U_1' = IR_1' = \frac{V}{2} \frac{R_1'(R_{11} - R_{21})}{R_{11}R_1' + R_{11}R_{21} + R_1'R_{21}} \quad (11)$$

With $R_{11}=R_0$ and $R_{21}=R_0+\Delta R$, it follows from this that:

$$|U_1'| = \frac{V}{2} \Delta \frac{R}{2R_0 + \Delta R + (R_0 + R_{21}\Delta R)R_0/R_1'} \quad (12)$$

With $R_0/(m-2) \leq |R_1'| \leq (R_0+\Delta R)/(m-2)$, the following then results:

$$\frac{V}{2} \Delta \frac{R/R_0}{\Delta R/R_0(m-1) + m} \leq |U_i'| \leq \frac{V}{2} \Delta \frac{R/R_0}{\Delta R/R_0 + m} \quad (13)$$

It then follows from this that:

$$|U_1'| \to 0 \text{ for } m \to \infty \quad (14)$$

As an example, with m=100 word lines, $\Delta R/R_0=0.2$ and U=2 V, the following are obtained:
$U_i'=0$ for like resistors in the i-th half-bridge, and
$U_i'<0$ for different resistors in the i-th half-bridge where 1.67 mV<$|U_1'|$<2.0 mV.

Figure 12:
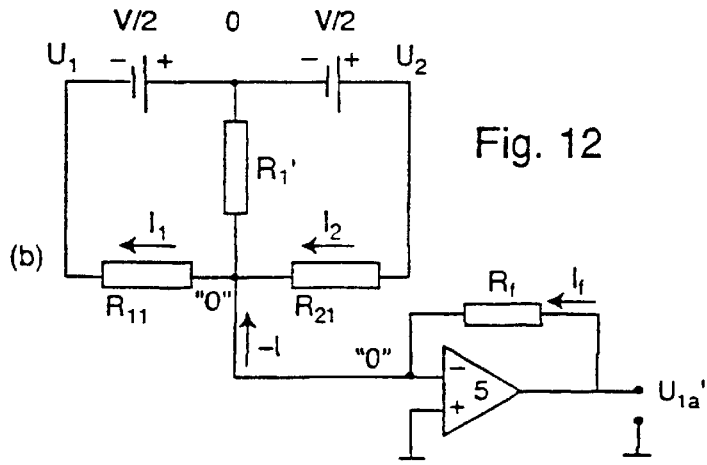

FIG. 12 shows the advantage, by comparison therewith, which can be attained with the use of the current follower 5.

The following first holds true for the currents:

$$-1 = I_1 - I_2 = \frac{V}{2R_{11}} - \frac{V}{2R_{21}} \quad (15)$$

With $R_{11}=R_0$, $R_{21}=R_0+\Delta R$, the following is obtained:

$$-I = \frac{V}{2R_0} - \frac{V}{2(R_0+\Delta R)} = \frac{V}{2} \Delta \frac{R}{R_0(R_0+\Delta R)} \quad (16)$$

With $U_{ia}'=-R_f I$, it follows that:

$$U_{1a}' = R_f \frac{V}{2} \Delta \frac{R}{R_0(R_0+\Delta R)} = \frac{R_f}{R_0} \frac{V}{2} \Delta \frac{R/R0}{(1+\Delta R/R_0)} \quad (17)$$

It can be seen from equation (17) that the output voltage $U_{1a}'$ is independent of m and hence independent of the number of word lines.

A concrete example where $\Delta R/R_0=0.2$, U=2 V and $R_f=R_0$ ($R_f$ is the resistance of the current follower 5 produces the following:

$U_{1a}'=0$ for like resistors in the i-th half-bridge and
$U_{1a}'=0.2/1.2$ V=0.166 V for different resistors in the i-th half-bridge, independently of m.

We claim:

1. A read/write architecture for a magnetoresistive random access memory (MRAM), comprising:
   bit lines;
   word lines crossing over said bit lines; and
   a multiplicity of ferromagnetic memory elements disposed at crossover points of said word lines and said bit lines and forming rows and columns of a matrix, each of said ferromagnetic memory elements containing a layered sequence having a separating layer and two ferromagnetic layers separated by said separating layer, said ferromagnetic memory elements having a resistance perpendicular to said layer sequence in each case higher than that of said word lines and of said bit lines and depends on a magnetization state of said ferromagnetic layers, said ferromagnetic memory elements each being connected between one of said word lines and one of said bit lines;
   at least one of said ferromagnetic memory elements functioning as a reference memory element having a known magnetization state, connections between said reference memory element and each of said ferromagnetic memory elements defining taps of resistance bridges and a resistance ratio of each of said ferromagnetic memory elements to said reference memory element can be determined by said resistance bridges, each of said resistance bridges including said reference memory element and one of said ferromagnetic memory elements.

2. The read/write architecture according to claim 1, wherein said reference memory element is one of a plurality of reference memory elements, and said ferromagnetic memory elements of at least one of said rows and said columns of said matrix are said reference memory elements.

3. The read/write architecture according to claim 1, wherein said resistance bridges are selected from the group consisting of half-bridges and full-bridges.

4. The read/write architecture according to claim 1, wherein voltages −V/2 and +V/2 can be respectively applied to said reference memory element and to a further one of said ferromagnetic memory elements.

5. The read/write architecture according to claim 1, wherein said separating layer is a layer selected from the group consisting of a barrier layer and a conductive layer made of non-ferroelectric material.

6. The read/write architecture according to claim 5, wherein said barrier layer is composed of $Al_2O_3$.

7. The read/write architecture according to claim 5, wherein said separating layer is composed of copper.

8. The read/write architecture according to claim 1, wherein said separating layer has a layer thickness of 1 to 3 nm.

9. The read/write architecture according to claim 1, wherein said ferromagnetic layers have a layer thickness of 3 to 20 nm.

10. The read/write architecture according to claim 1, including current followers connected to said resistance bridges.

11. The read/write architecture according to claim 10, wherein one of said current followers is provided for each of said rows and each of said columns, respectively.

* * * * *